(12) United States Patent
Hoegerl et al.

(10) Patent No.: US 10,985,110 B2
(45) Date of Patent: *Apr. 20, 2021

(54) SEMICONDUCTOR PACKAGE HAVING AN ELECTROMAGNETIC SHIELDING STRUCTURE AND METHOD FOR PRODUCING THE SAME

(71) Applicant: Infineon Technologies AG, Neubiberg (DE)

(72) Inventors: Juergen Hoegerl, Regensburg (DE); Ordwin Haase, Taufkirchen (DE); Tobias Kist, Effeltrich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/519,571

(22) Filed: Jul. 23, 2019

(65) Prior Publication Data

US 2020/0035616 A1 Jan. 30, 2020

(30) Foreign Application Priority Data

Jul. 25, 2018 (DE) .......................... 102018212438.8

(51) Int. Cl.
*H01L 23/552* (2006.01)
*H01L 23/31* (2006.01)
(Continued)

(52) U.S. Cl.
CPC ........ *H01L 23/552* (2013.01); *H01L 21/4853* (2013.01); *H01L 21/4871* (2013.01);
(Continued)

(58) Field of Classification Search
CPC ............... H01L 23/552; H01L 23/3121; H01L 23/3675; H01L 23/3735; H01L 24/32; H01L 21/4853
See application file for complete search history.

(56) References Cited

U.S. PATENT DOCUMENTS 8,358,000 B2   1/2013   Beaupre et al.
8,654,554 B2   2/2014   Seki
(Continued)

FOREIGN PATENT DOCUMENTS

DE   102014209690 A1   11/2015
DE   112014004147 T5    7/2016
DE   102016115221 A1    2/2018
DE   102016119485 A1    4/2018

*Primary Examiner* — Anthony Ho
(74) *Attorney, Agent, or Firm* — Murphy, Bilak & Homiller, PLLC (57) ABSTRACT

A semiconductor package having a double-sided cooling structure includes an upper electrically conductive element having an outwardly exposed metal surface, a lower carrier substrate having an upper electrically conductive layer, a lower electrically conductive layer having an outwardly exposed surface, and an electrical insulation layer arranged between the upper and lower electrically conductive layers, a first electrically conductive spacer arranged between the upper electrically conductive element and the upper electrically conductive layer, a power semiconductor chip arranged between the upper electrically conductive element and the upper electrically conductive layer, a second electrically conductive spacer arranged between the upper electrically conductive element and the power semiconductor chip, and a shielding structure configured to electromagnetically shield a line of the semiconductor package.

17 Claims, 5 Drawing Sheets

(51) Int. Cl.
*H01L 23/367* (2006.01)
*H01L 23/373* (2006.01)
*H01L 23/00* (2006.01)
*H01L 25/07* (2006.01)
*H01L 25/00* (2006.01)
*H01L 21/48* (2006.01)
*H01L 21/56* (2006.01)
*H01L 21/66* (2006.01)

(52) U.S. Cl.
CPC ............ *H01L 21/565* (2013.01); *H01L 22/32* (2013.01); *H01L 23/3121* (2013.01); *H01L 23/3675* (2013.01); *H01L 23/3735* (2013.01); *H01L 24/32* (2013.01); *H01L 25/072* (2013.01); *H01L 25/50* (2013.01); *H01L 2224/32225* (2013.01); *H01L 2924/10272* (2013.01); *H01L 2924/13055* (2013.01); *H01L 2924/14252* (2013.01)

(56) References Cited

U.S. PATENT DOCUMENTS

| | | |
|---|---|---|
| 10,002,821 B1 | 6/2018 | Hoegerl |
| 10,128,165 B2 | 11/2018 | Hable et al. |
| 10,348,214 B2 | 7/2019 | Nakatsu et al. |
| 2007/0090814 A1 | 4/2007 | Hashimoto et al. |
| 2017/0287875 A1 | 10/2017 | Gao et al. |
| 2018/0102302 A1 | 4/2018 | Grassmann et al. |
| 2018/0145007 A1 | 5/2018 | Hatano et al. |
| 2020/0286865 A1 | 9/2020 | Chew et al. |

Fig. 5

SEMICONDUCTOR PACKAGE HAVING AN ELECTROMAGNETIC SHIELDING STRUCTURE AND METHOD FOR PRODUCING THE SAME

TECHNICAL FIELD

The present disclosure relates to a semiconductor package having a double-sided cooling structure, which semiconductor package has an electromagnetic shielding structure. The present disclosure furthermore relates to a method for producing a semiconductor package having a double-sided cooling structure and an electromagnetic shielding structure.

BACKGROUND

The constantly increasing requirements made of the performance of electrical circuits for high currents, e.g. in electrical drives for motor vehicles, require further development and improvement of semiconductor packages which are used in such circuits. Such circuits can have inverters, for example, which convert a battery voltage into an AC voltage for the drive of an electric motor. Such an inverter can be realized by a suitable circuit in a semiconductor package, wherein, with regard to the performance of the inverter, it is crucial to achieve sufficient cooling, the lowest possible impedance, the lowest possible leakage inductances, etc. in the semiconductor package. Furthermore, it may be necessary to electromagnetically shield lines in the semiconductor package from their surroundings, e.g. in order to ensure the entirely satisfactory functioning of the circuit realized in the semiconductor package. The performance of such inverters can be increased further by means of improved semiconductor packages and/or by means of improved methods for producing such semiconductor packages.

The problem addressed by the invention is solved by the features of the independent patent claims. Advantageous embodiments and developments of the invention are specified in the dependent claims.

SUMMARY

Individual examples relate to a semiconductor package having a double-sided cooling structure, the semiconductor package comprising an upper electrically conductive element having an outwardly exposed metal surface, a lower carrier substrate having an upper electrically conductive layer, a lower electrically conductive layer having an outwardly exposed surface, and an electrical insulation layer arranged between the upper and lower electrically conductive layers, a first electrically conductive spacer arranged between the upper electrically conductive element and the upper electrically conductive layer, at least one power semiconductor chip arranged between the upper electrically conductive element and the upper electrically conductive layer, a second electrically conductive spacer arranged between the upper electrically conductive element and the power semiconductor chip, and a shielding structure configured to electromagnetically shield a line of the semiconductor package.

Individual examples relate to a method for producing a semiconductor package having a double-sided cooling structure, the method comprising providing a lower carrier substrate having an upper electrically conductive layer, a lower electrically conductive layer and an electrical insulation layer arranged between the upper and lower electrically conductive layers, applying a first electrically conductive spacer to the upper electrically conductive layer of the lower carrier substrate, applying at least one power semiconductor chip to the upper electrically conductive layer of the lower carrier substrate, applying a second electrically conductive spacer to the power semiconductor chip, applying an upper electrically conductive element on the spacers opposite the lower carrier substrate, and forming a shielding structure in such a way that a line of the semiconductor package is electromagnetically shielded by the shielding structure.

BRIEF DESCRIPTION OF THE DRAWINGS

The accompanying drawings illustrate examples and together with the description serve to explain the principles of the disclosure. The elements in the drawings are not necessarily true to scale with respect to one another. Identical reference signs may designate mutually corresponding, similar or identical parts.

DETAILED DESCRIPTION

In the present description, the expressions "coupled", "electrically coupled" and/or "electrically connected" are not intended to mean that the elements must be directly coupled; intervening elements can be provided between the "coupled" or "electrically coupled" elements, e.g. solder layers.

Figure 1A:
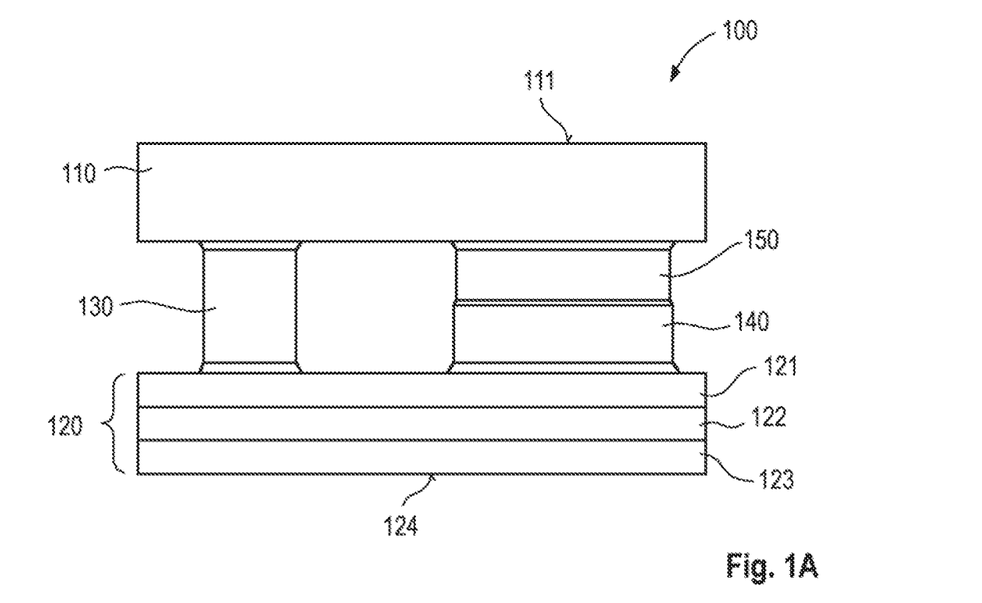
FIG. 1A illustrates a side view of a semiconductor package having a double-sided cooling structure.

FIG. 1A shows a semiconductor package 100 having a double-sided cooling structure in accordance with the disclosure. In this case, "double-sided cooling structure" means that the semiconductor package 100 has an upper electrically conductive element 110 and a lower carrier substrate 120, which can each act as a cooling structure of the semiconductor package 100. The semiconductor package 100 furthermore has a first electrically conductive spacer 130, at least one power semiconductor chip 140 and a second electrically conductive spacer 150. The second electrically conductive spacer 150 is arranged between the upper electrically conductive element 110 and the power semiconductor chip 140.

The lower carrier substrate 120 has an upper electrically conductive layer 121, a lower electrically conductive layer 123 and an electrical insulation layer 122 arranged between the upper 121 and lower 123 conductive layer. The lower carrier substrate 120 can be e.g. a substrate of the DCB (direct copper bond), DAB (direct aluminum bond), or AMB (active metal brazing) type.

In accordance with one example, the semiconductor package 100 can furthermore have an encapsulation body (not shown), which encapsulates the spacers 130, 150, the at least one power semiconductor chip 140, the upper electrically conductive element 110 and the lower carrier substrate 120. In particular, an interspace between the upper electrically conductive element 110 and the lower carrier substrate 120 can be wholly or partly filled by the encapsulation body. However, a metal surface 111 of the upper electrically conductive element 110 and a surface 124 of the lower electrically conductive layer 123 are embodied at all events such that they are wholly or at least partly outwardly exposed (that is to say that the surfaces 111, 124 constitute outer surfaces of the semiconductor package 100).

In accordance with one example, the encapsulation body can comprise or consist of a potting compound or molding compound. The encapsulation body can be produced e.g. by means of compression molding. In order to produce the encapsulation body, e.g. the as yet unencapsulated semiconductor package 100 can be placed into a molding tool, a dielectric compound can be injected, and the dielectric compound can be cured to form the encapsulation body.

The electrically conductive spacers 130, 150 can consist of a metal or a metal alloy and can comprise or consist of e.g. Al or Cu. The first electrically conductive spacer 130 is physically and electrically connected to the upper electrically conductive element 110 and the lower carrier substrate 120, e.g. by means of solder connections or by means of electrically conductive adhesive.

In accordance with one example, the at least one power semiconductor chip 140 comprises or consists of SiC. In accordance with one example, the at least one power semiconductor chip 140 is a chip of the IGBT (insulated-gate bipolar transistor) type. In accordance with one example, a half-bridge circuit is realized in the semiconductor package 100. The half-bridge circuit can have a power terminal for a positive supply voltage ($V_{DD}$), a power terminal for a negative supply voltage ($V_{SS}$) and a power terminal configured as a phase.

The second electrically conductive spacer 150 can be electrically connected to an electrode (not shown) of the power semiconductor chip 140 and to the upper electrically conductive element 110, e.g. by means of solder connections or by means of electrically conductive adhesive. The electrode can be a power electrode or a control electrode of the power semiconductor chip 140. The second electrically conductive spacer 150 can wholly or partly cover the power semiconductor chip 140.

In accordance with one example, the semiconductor package can have external terminals in the form of terminal fingers. At least one portion of said external terminals can be designed to electrically connect electrodes of the at least one power semiconductor chip 140 to the outside world. The external terminals can be electrically connected to the upper electrically conductive element 110 and/or to the upper electrically conductive layer 121. The terminal fingers can be parts of a leadframe. Individual terminals from among the external terminals can be power terminals, which can be electrically connected e.g. to respective power electrodes of the at least one power semiconductor chip 140. One or a plurality of the external terminals can be control terminals, which are electrically connected to a control electrode (e.g. a gate electrode) of the at last one power semiconductor chip 140. Individual terminals from among the external terminals can be measurement terminals, which are designed e.g. to measure $V_{DD}$, $V_{SS}$, the voltage of the phase, a current flow or a temperature in the semiconductor package 100.

A shielding structure is arranged in the semiconductor package 100, said shielding structure being configured to electromagnetically shield one or more lines of the semiconductor package 100. The electromagnetic shielding can serve to prevent the electrical switching behavior of the electrical circuit formed in the semiconductor package 100 from being disturbed electromagnetically from outside. The electromagnetic shielding can also serve to prevent the electrical circuit formed in the semiconductor package 100 from inducing, for its part, a disturbance in another component part by means of electromagnetic influencing. Said lines to be shielded can comprise e.g. one or more control terminals and/or one or more measurement terminals. The shielding structure can be formed in the upper electrically conductive layer 121 and/or in the upper electrically conductive element 110 and/or in the leadframe.

The shielding structure can be designed to be at $V_{SS}$ or at $V_{DD}$. A shielding structure that is at $V_{SS}$ or $V_{DD}$ can be designed as a low-impedance shielding of the phase. This can at least partly prevent the phase from effecting electromagnetic emission toward the outside and acting as an interference source for other component parts.

In the case where the line to be shielded is a control line, it holds true that control signals at significantly more than 10 kHz can be present on the control line, particularly if the at least one power semiconductor chip 140 is SiC-based. Therefore, such control lines can function like antennas and, without electromagnetic shielding, would couple power into the surroundings and/or take up power from the surroundings. Taking up power from the surroundings could result in the control signals being disturbed and the switching behavior of the electrical circuit being adversely influenced. A corresponding shielding can contribute to ensuring fault-free switching of the at least one power semiconductor chip 140. This analogously also applies to other types of lines in the semiconductor package 100.

The semiconductor package 100 can comprise a control line formed in the upper electrically conductive layer 121, said control line being electrically connected to a control electrode of the at least one power semiconductor chip and to a control terminal. The shielding structure can surround the control line and the control terminal connected thereto at at least two sides.

Figure 1B:
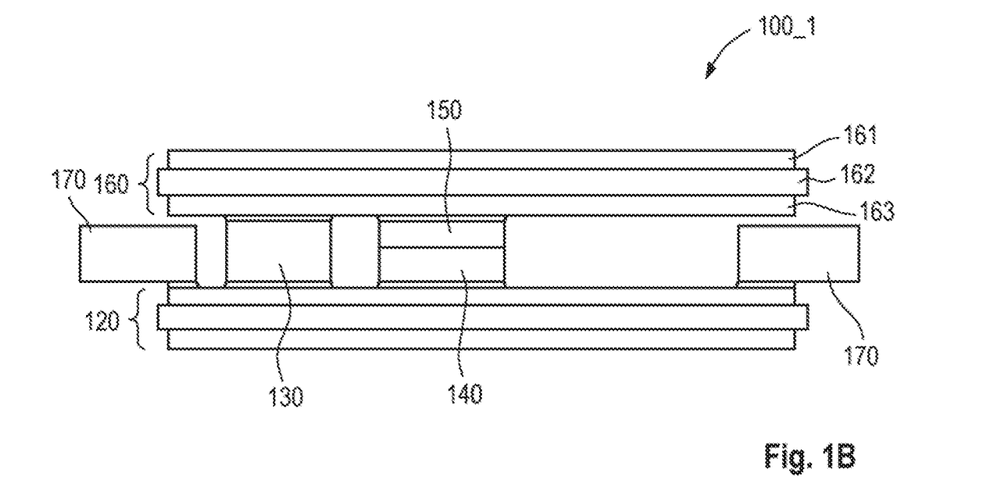
FIG. 1B illustrates a side view of a further semiconductor package having a double-sided cooling structure.

FIG. 1B shows a semiconductor package 100_1, which can correspond to the semiconductor package 100 from FIG. 1A apart from the differences described below. In the case of the semiconductor package 100_1, the upper electrically conductive element 110 has an upper carrier substrate 160 having an upper electrically conductive layer 161, a lower electrically conductive layer 163 and an electrical insulation layer 162 arranged between the upper 161 and lower 163 electrically conductive layer. In this case, the upper electrically conductive layer 161 corresponds to the outwardly exposed metal surface 111.

The semiconductor package 100_1 can furthermore have external terminals 170, which, as shown in FIG. 1B, are arranged between the upper carrier substrate 160 and the lower carrier substrate 120. In accordance with one example, each individual one of the external terminals 170 can be electrically connected to the lower electrically conductive layer 163 of the upper carrier substrate 160 or to the upper electrically conductive layer 121 of the lower carrier substrate 120.

The lower electrically conductive layer 163 of the upper carrier substrate 160 and the upper electrically conductive layer 121 of the lower carrier substrate 120 are structured and can have e.g. chip islands, conduction tracks and/or application locations for the electrically conductive spacers 130, 150.

Figure 2:
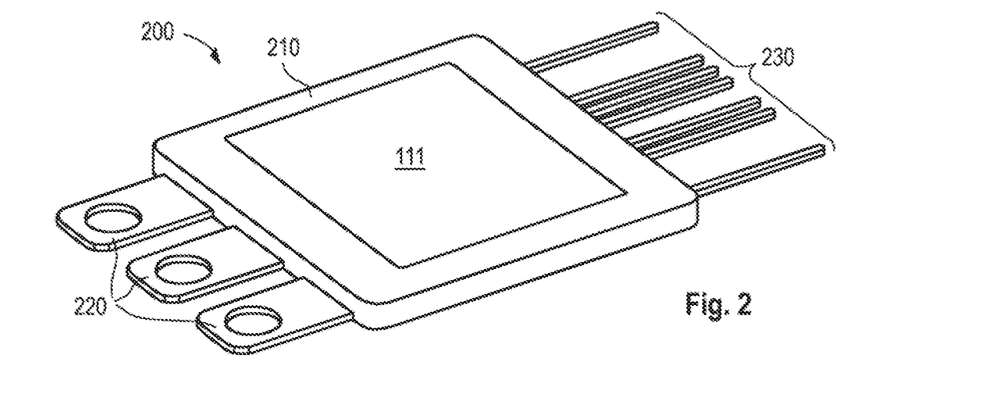
FIG. 2 illustrates a perspective view of a semiconductor package having a double-sided cooling structure, which furthermore comprises an encapsulation body.

FIG. 2 shows a perspective view of a semiconductor package 200, which can be identical to the semiconductor packages 100 and 100_1. The semiconductor package 200 has an encapsulation body 210, which encapsulates the spacers 130, 150, the upper electrically conductive element 110, the lower carrier substrate 120 and the at least one power semiconductor chip 140. The surfaces 111 and the surface 124 (not visible in FIG. 2) are exposed at the encapsulation body 210 at opposite sides of the semiconductor package 200.

The encapsulation body 210 consists of a suitable electrically insulating material or comprises such a material, e.g. a plastic, a polymer or a resin. The encapsulation body 210 can be e.g. a molded body.

The surface 111 and/or the surface 124 can have an electrically insulating coating and can be configured in each case for the application of a heat sink.

The semiconductor package 200 has external terminals 220, 230 arranged at side surfaces of the semiconductor package 200 which connect the opposite sides to the metal surface 111 and the surface 124. The external terminals 220 can be designed as power terminals and the external terminals 230 can be designed as control terminals or measurement terminals. In accordance with one example, the power terminals are arranged only at one side of the semiconductor package and the control and/or measurement terminals are arranged only at an opposite side. In accordance with another example, a power terminal configured as a phase is arranged at the side having the control or measurement terminals. The external terminals 220 and 230 can be parts of a common leadframe.

Figure 3A:
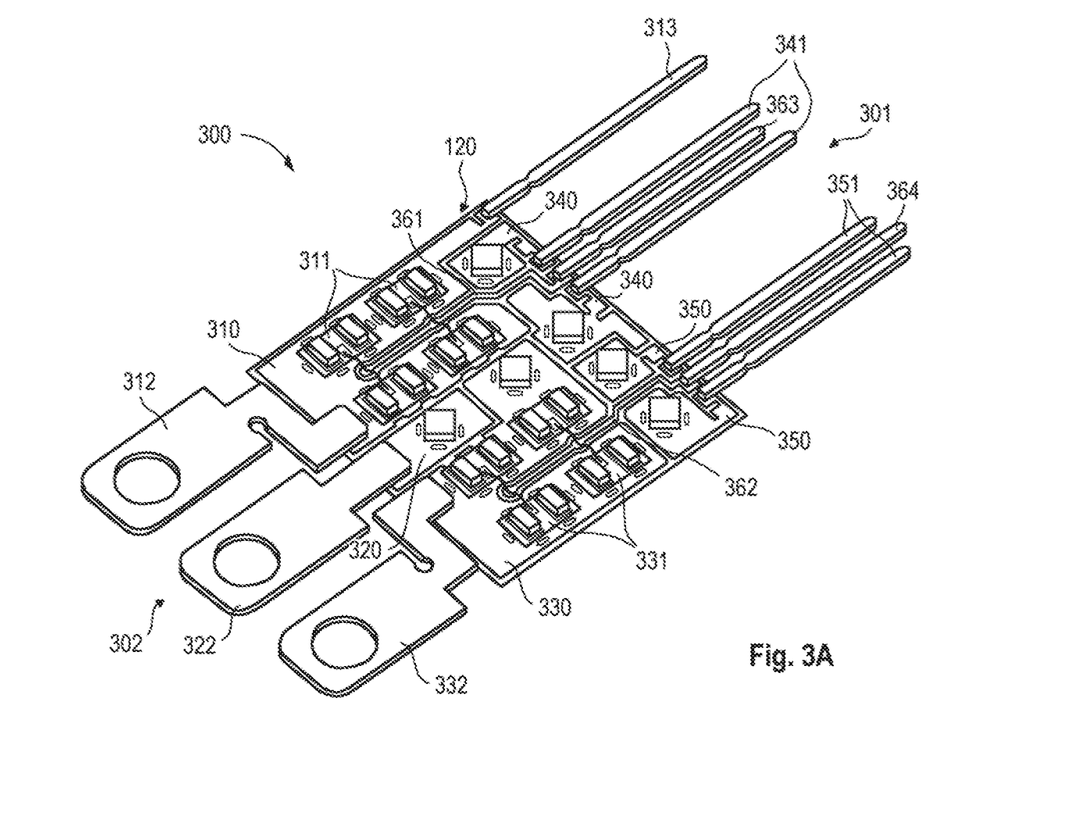
FIG. 3A illustrates a perspective view of a lower carrier substrate of a further semiconductor package.

FIG. 3A shows a perspective view of a lower carrier substrate 120 of a semiconductor package 300. The semiconductor package 300 can be identical to the semiconductor packages 100, 100_1 and 200.

The upper electrically conductive layer 121 of the semiconductor package 300 can have a first structured region 310, a second structured region 320, a third structured region 330, fourth structured regions 340 and fifth structured regions 350.

First power semiconductor chips 311 can be arranged on the first region 310 and be electrically connected thereto. By way of example, a power electrode (e.g. a drain electrode) arranged at the underside of the first power semiconductor chips 311 can be connected to the first region 310 by means of a solder layer. The first region 310 can be designed for applying $V_{DD}$. The first region 310 can be electrically connected to a first power terminal 312. The first power semiconductor chips 311 can be embodied as high-side power semiconductor chips of a half-bridge circuit set up in the semiconductor package 300.

Second power semiconductor chips 331 can be arranged on the third region 330 and be electrically connected thereto. By way of example, a power electrode (e.g. a drain electrode) arranged at the underside of the second power semiconductor chips 331 can be connected to the third region 330 by means of a solder layer. The third region 330 can be designed as a phase of the half-bridge circuit. The third region 330 can be electrically connected to a third power terminal 332. The second power semiconductor chips 331 can be embodied as low-side power semiconductor chips of the half-bridge circuit. The third region 330 can be electrically connected to the upper carrier substrate 160, e.g. via an electrically conductive spacer 130.

The second region 320 can be arranged between the first region 310 and the third region 330 on the lower carrier substrate 120. The second region 320 can be electrically connected to a second power terminal 322 and can be designed for applying $V_{SS}$. The second region 320 can be electrically connected to the upper carrier substrate 160, e.g. via an electrically conductive spacer 130.

The fourth regions 340 can be electrically connected to the upper carrier substrate 160, e.g. via electrically conductive spacers 130, and they can be designed for applying the phase. The fifth regions 350 can be electrically connected to the upper carrier substrate 160, e.g. via electrically conductive spacers 130, and they can be designed for applying $V_{SS}$.

The upper electrically conductive layer 121 of the semiconductor package 300 can furthermore have a first control line 361 and a second control line 362. The first control line 361 can be at least partly surrounded by the first region 310 on two sides and the second control line can be at least partly surrounded by the third region 330 on two sides. Control electrodes, e.g. gate electrodes, of the first power semiconductor chips 311 can be electrically connected to the first control line 361, e.g. by means of bond wires. Control electrodes, e.g. gate electrodes, of the second power semiconductor chips 331 can be electrically connected to the second control line 362, e.g. by means of bond wires. The first and second control lines 361, 362 can each have an elongate shape, that is to say that a length of the control lines 361, 362 can be significantly greater than the width thereof, e.g. more than 10 times greater or more than 15 times or more than 20 times greater.

The control lines 361, 362 can extend at a first side 301 of the lower carrier substrate 120 as far as the edge or almost as far as the edge of the lower carrier substrate 120. The first control line 361 can be electrically connected to a first control terminal 363 at the first side 301 and the second control line 362 can be electrically connected to a second control terminal 364 at the first side 301. The first and second control terminals 363, 364 can each comprise a terminal finger.

In accordance with one example, the first control terminal 363 and respectively the second control terminal 364 are surrounded on the left and right by a first part of the shielding structure. Said first part of the shielding structure can e.g. be in the form of terminal fingers 341 and 351. The terminal fingers 341 are electrically connected to the fourth region 340 and the terminal fingers 351 are electrically connected to the fifth region.

In accordance with one example, the first part of the shielding structure has more than only one terminal finger 341 and 351 on the left and right of the first control terminal 363 and the second control terminal 364, respectively, e.g. in each case two terminal fingers 341 and 351, respectively, on the left and right. The further terminal fingers 341 and 351 are likewise electrically connected to the fourth regions 340 and the fifth regions 350, respectively. The use of more than one terminal finger on the left and right can contribute to further improvement of the electromagnetic shielding by the shielding structure.

With regard to the first control line 361, the first region 310 can be a third part of the shielding structure, said third part being formed in the upper electrically conductive layer 121. The fourth regions 340 can likewise be parts of said third part of the shielding structure for the first control line 361. With regard to the second control line 362, the third region 330 can be a third part of the shielding structure, said third part being formed in the upper electrically conductive layer 121. The fifth regions 350 can likewise be parts of said third part of the shielding structure for the second control line 362.

In accordance with one example, the semiconductor package 300 furthermore comprises a measurement terminal 313, which is electrically connected to the first region 310 and is designed for measuring $V_{DD}$. The control terminals 363 and 364, the terminal fingers 341 and 351 and the measurement terminal 313 can all be arranged at the first side 301 of the lower carrier substrate 120, and the power terminals 312, 322 and 332 can all be arranged at an opposite second side 302. The control terminals 363 and 364, the terminal fingers 341 and 351, the measurement terminal 313 and the power terminals 312, 322 and 332 can all be part of a leadframe.

Figure 3B:
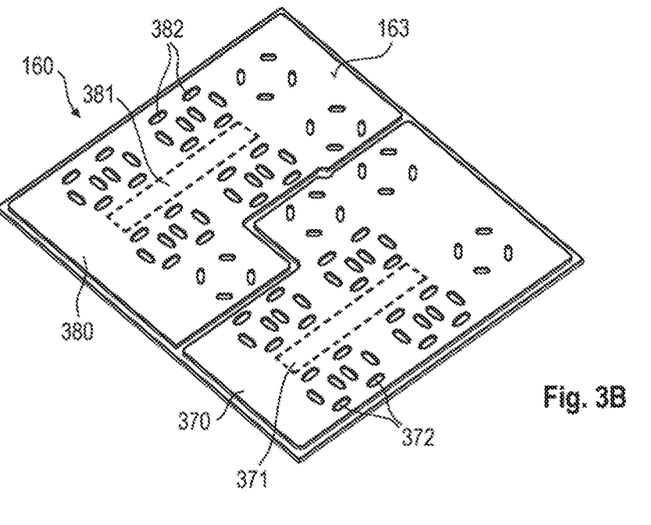
FIG. 3B illustrates the upper cooling structure in perspective view.
Figure 3C:
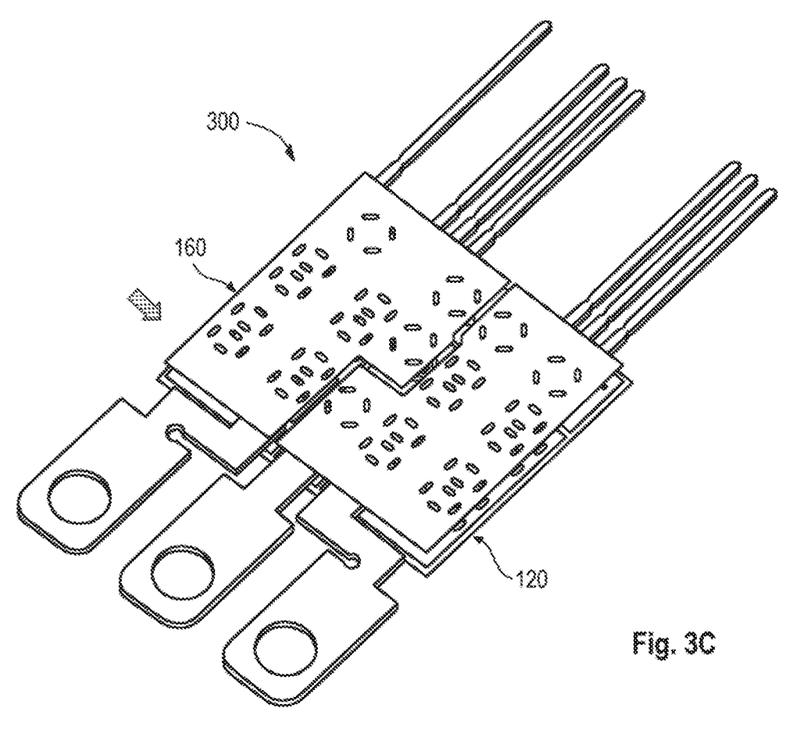
FIG. 3C illustrates the assembled semiconductor package in perspective view.

FIG. 3B shows a perspective view of an upper carrier substrate 160 of the semiconductor package 300, wherein FIG. 3B shows a perspective view of the underside of the upper carrier substrate 160 (cf. the arrow in FIG. 3C for the viewing direction).

The lower electrically conductive layer 163 of the upper carrier substrate 160 is structured and has a sixth region 370 and a seventh region 380. In the assembled semiconductor package 300 (cf. FIG. 3C), the sixth region 370 overlaps the first region 310 of the lower carrier substrate 120. In the assembled semiconductor package 300, the seventh region 380 overlaps the second region 320 and the third region 330 of the lower carrier substrate 120.

A first area 371 is arranged in the sixth region 370, said first area being completely filled with the lower electrically conductive layer 163. A second area 381 is arranged in the seventh region 380, said second area being completely filled with the lower electrically conductive layer 163. In the assembled semiconductor package 300, the first area 371 covers the first control line 361 and the second area 381 covers the second control line 381. In the assembled semiconductor package 300, the first area 311 is a second part of the shielding structure for the first control line 361 and is electrically connected to the fourth regions 340 and the terminal fingers 341. In the assembled semiconductor package 300, the second area 381 is a second part of the shielding structure for the second control line 362 and is electrically connected to the fifth regions 350 and the terminal fingers 351. In this way, the first control line 361 and respectively the second control line 362 can be surrounded by the respective shielding structure on at least three sides.

In accordance with one example, the terminal fingers 341 are configured as a first part of the shielding structure for electromagnetically shielding the control terminal 363, and the area 371 and the regions 310, 340 are configured as a second and respectively a third part of the shielding structure for electromagnetically shielding the control line 361. Analogously, the terminal fingers 351 are configured as a first part of the shielding structure for electromagnetically shielding the control terminal 364, and the area 381 and the regions 330, 350 are configured as a second and respectively a third part of the shielding structure for electromagnetically shielding the control line 362.

Cutouts 372, 382 can be provided in the sixth region 370 and in the seventh region 380, said cutouts bounding connection points at which the lower electrically conductive layer 163 of the upper carrier substrate 160 is applied to electrically conductive spacers 130, 150 (cf. FIG. 1A). The first area 371 and the second area 381 are free of such cutouts 372, 382.

FIG. 3C shows the semiconductor package 300 after the arrangement of the upper carrier substrate 160 above the lower carrier substrate 120 from FIG. 3A. For the sake of clarity, FIG. 3C shows only the lower conductive layer 163 of the upper carrier substrate 160; the upper electrically conductive layer 161 and the insulation layer 162 have been omitted. The sixth region 370 can wholly or partly cover the first region 310 and the fourth regions 340, and the seventh region 380 can wholly or partly cover the second region 320, the third region 330 and the fifth regions 350. The sixth region 370 can be electrically connected to the third region 330 and to the fourth regions 340 by means of electrically conductive spacers, and the seventh region 380 can be electrically connected to the second region 320 and to the fifth regions 350 by means of electrically conductive spacers.

Figure 3D:
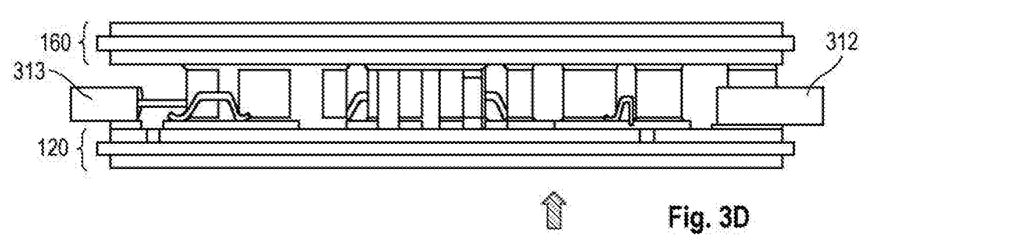
FIG. 3D illustrates a side view of the semiconductor package.

FIG. 3D shows a side view of the semiconductor package 300 along the direction of the arrow in FIG. 3C.

Figure 4:
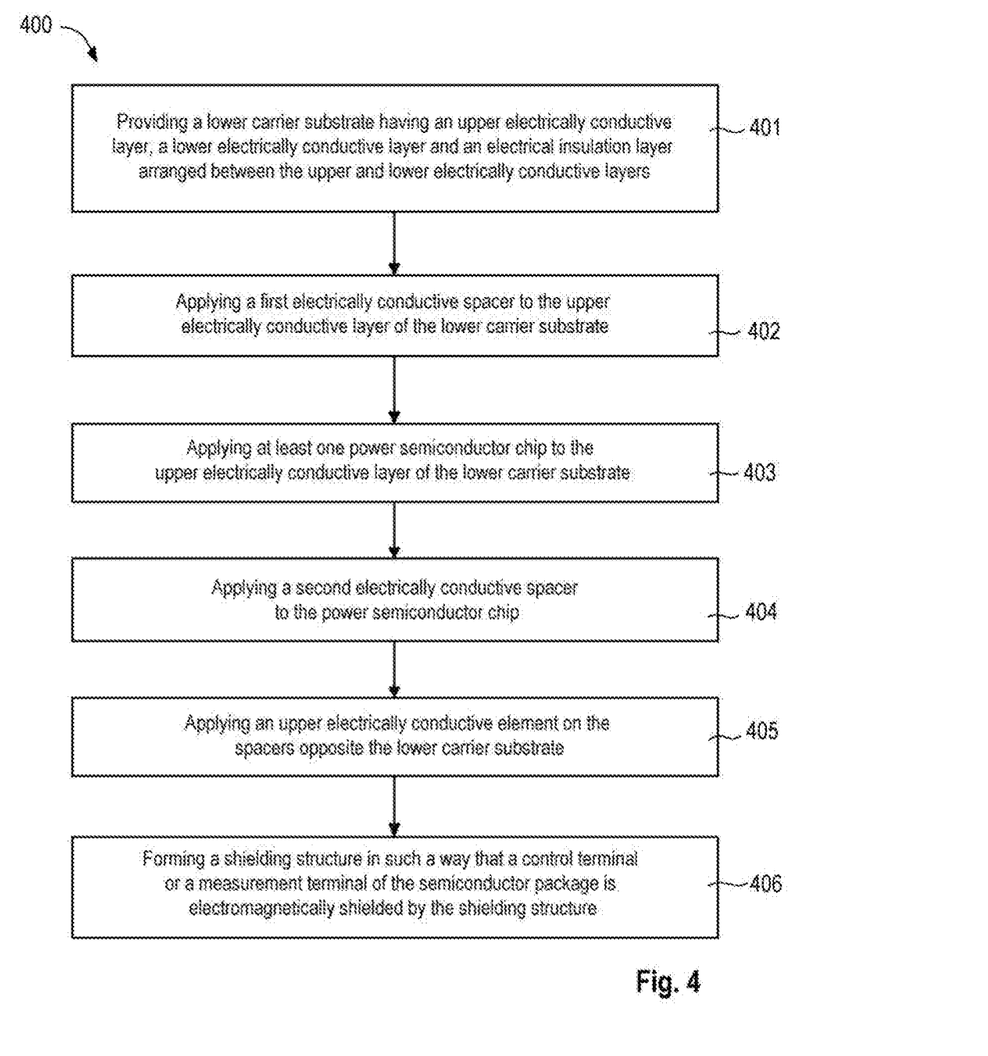
FIG. 4 illustrates a flow diagram of a method for producing a semiconductor package.

FIG. 4 shows a flow diagram of a method 400 for producing a semiconductor package having a double-sided cooling structure. In accordance with the method 400, by way of example, the semiconductor packages 100, 100_1, 200 and 300 can be produced.

The method 400 comprises, at 401, providing a lower carrier substrate having an upper electrically conductive layer, a lower electrically conductive layer and an electrical insulation layer arranged between the upper and lower electrically conductive layers. The method 400 comprises, at 402, applying a first electrically conductive spacer to the upper electrically conductive layer of the lower carrier substrate. The method 400 comprises, at 403, applying at least one power semiconductor chip to the upper electrically conductive layer of the lower carrier substrate. The method 400 comprises, at 404, applying a second electrically conductive spacer to the power semiconductor chip. The method 400 comprises, at 405, applying an upper electrically conductive element on the spacers opposite the lower carrier substrate. The method 400 comprises, at 406, forming a shielding structure in such a way that a control terminal or a measurement terminal of the semiconductor package is electromagnetically shielded by the shielding structure.

The method 400 can furthermore comprise arranging a second and a third terminal finger on both sides alongside a first terminal finger of the control terminal of the semiconductor package for forming a first part of the shielding structure. The method 400 can furthermore comprise forming a control line in the upper electrically conductive layer of the lower carrier substrate, wherein the control line electrically connects a control electrode of the at least one power semiconductor chip to the control terminal, and wherein the control line is surrounded by the shielding structure at least at three sides. The method 400 can furthermore comprise etching the upper electrically conductive element in order to produce a second part of the shielding structure, wherein the second part of the shielding structure overlaps the control line. The method 400 can furthermore comprise etching the upper electrically conductive layer of the lower carrier substrate in order to produce a third part of the shielding structure, wherein the third part surrounds the control line on both sides.

Figure 5:
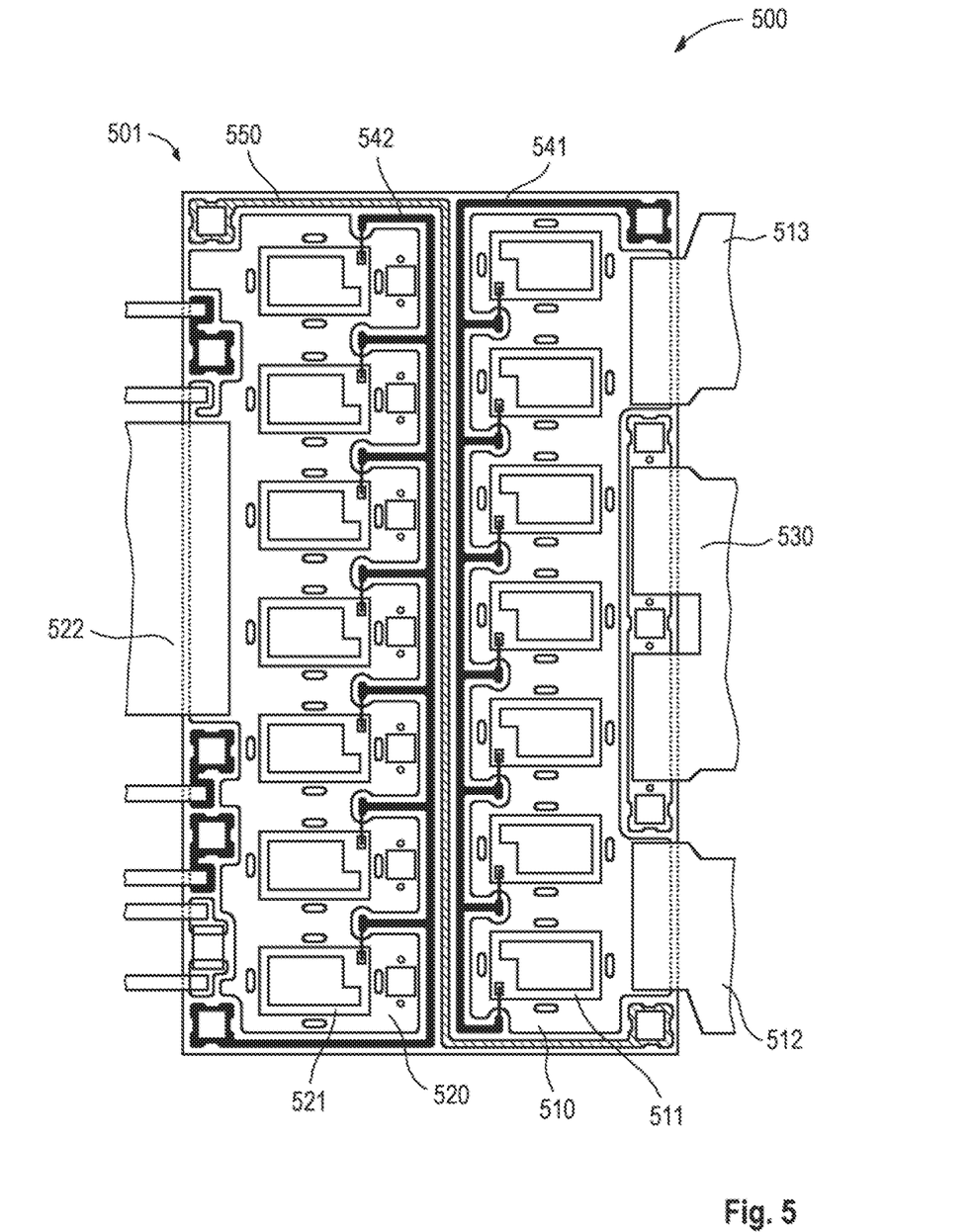
FIG. 5 illustrates one example of a semiconductor package having a shielding structure arranged between two signal lines.

FIG. 5 shows a further example of a semiconductor package 500, wherein the semiconductor package 500 can be similar to the semiconductor packages 100, 100_1, 200 and 300 and have, in comparison therewith, only the differences shown below. For the sake of clarity, the upper carrier substrate and a possible encapsulation body of the semiconductor package 500 are not shown in FIG. 5.

The lower carrier substrate 501 of the semiconductor package 500 has a first carrier region 510 with first power semiconductor chips 511 and a second carrier region 520 with second power semiconductor chips 521. The first carrier region 510 can be designed e.g. for applying $V_{DD}$ and the second carrier region 520 can be designed e.g. as a phase.

The first carrier region 510 can be connected to a first power terminal 512 and a second power terminal 513. A third power terminal 530 can be arranged between the first and second power terminals 512, 513. The third power terminal 530 can be connected to the upper carrier substrate of the semiconductor package 500 and can be a $V_{SS}$ terminal. The second carrier region 520 can be connected to a fourth power terminal 522.

Control electrodes (e.g. gate electrodes) of the first power semiconductor chips 511 can be connected to a first control line 541, and control electrodes (e.g. gate electrodes) of the second power semiconductor chips 521 can be connected to a second control line 542.

A shielding structure 550 is formed between the first control line 541 and the second control line 542, said shielding structure electromagnetically shielding the control lines 541, 542, in particular from one another. The control lines 541, 542 and the shielding structure 550 can be formed as structured regions in the upper electrically conductive layer of the lower carrier substrate 501.

In accordance with one example, the shielding structure 550 is electrically connected to the upper carrier substrate of the semiconductor package 500, e.g. via one or more electrically conductive spacers. The shielding structure 550 can be configured in particular for applying $V_{SS}$.

Although specific embodiments have been illustrated and described herein, it is obvious to the person of average skill in the art that a multiplicity of alternative and/or equivalent implementations can replace the specific embodiments shown and described, without departing from the scope of the present disclosure. This application is intended to cover all adaptations or variations of the specific embodiments discussed herein. Therefore, the intention is for this disclosure to be restricted only by the claims and the equivalents thereof.

What is claimed is:

1. A double-sided coolable semiconductor package, comprising:
    an upper electrically conductive element having an outwardly exposed metal surface;
    a lower carrier substrate having an upper electrically conductive layer, a lower electrically conductive layer having an outwardly exposed surface, and an electrical insulation layer arranged between the upper and lower electrically conductive layers;
    a first electrically conductive spacer arranged between the upper electrically conductive element and the upper electrically conductive layer;
    a power semiconductor chip arranged between the upper electrically conductive element and the upper electrically conductive layer;
    a second electrically conductive spacer arranged between the upper electrically conductive element and the power semiconductor chip; and
    a shielding structure configured to electromagnetically shield a line of the double-sided coolable semiconductor package,
    wherein the line comprises a control terminal or a measurement terminal of the double-sided coolable semiconductor package,
    wherein the control terminal and/or the measurement terminal and at least one part of the shielding structure are formed in a leadframe.

2. The double-sided coolable semiconductor package of claim 1, wherein the upper electrically conductive element has an upper carrier substrate comprising an upper electrically conductive layer, a lower electrically conductive layer and an electrical insulation layer arranged between the upper and lower electrically conductive layers, and wherein the upper electrically conductive layer corresponds to the outwardly exposed metal surface.

3. The double-sided coolable semiconductor package of claim 1, further comprising:
    a control line formed in the upper electrically conductive layer of the lower carrier substrate and electrically connected to the control terminal and a control electrode of the power semiconductor chip,
    wherein a part of the shielding structure is formed in the upper electrically conductive layer of the lower carrier substrate and surrounds the control line on both sides.

4. The double-sided coolable semiconductor package of claim 3, wherein the power semiconductor chip is a high-side power semiconductor of a half-bridge circuit, and wherein the part of the shielding structure formed in the upper electrically conductive layer of the lower carrier substrate is configured to apply a positive supply voltage.

5. The double-sided coolable semiconductor package of claim 4, wherein the first electrically conductive spacer electrically connects the part of the shielding structure formed in the leadframe to the part of the shielding structure formed in the upper electrically conductive layer of the lower carrier substrate.

6. The double-sided coolable semiconductor package of claim 1, wherein the control terminal or the measurement terminal comprises a first terminal finger, wherein the part of the shielding structure formed in the leadframe comprises a second and a third terminal finger, and wherein the first terminal finger) is arranged between the second and third terminal fingers.

7. The double-sided coolable semiconductor package of claim 1, wherein the measurement terminal is configured to measure a current flow or a temperature in the double-sided coolable semiconductor package.

8. The double-sided coolable semiconductor package of claim 1, further comprising:
    a first power terminal, a second power terminal and a third power terminal arranged at a first side of the double-sided coolable semiconductor package,
    wherein the control terminal is arranged at a second side of the double-sided coolable semiconductor package opposite the first side.

9. The double-sided coolable semiconductor package of claim 1, further comprising:
    an encapsulation body arranged between the lower carrier substrate and the upper electrically conductive element,
    wherein the encapsulation body encapsulates the first electrically conductive spacer, the second electrically conductive spacer, the power semiconductor chip, the upper electrically conductive element and the lower carrier substrate.

10. The double-sided coolable semiconductor package of claim 9, wherein the encapsulation body comprises a molding compound.

11. The double-sided coolable semiconductor package of claim 1, wherein the power semiconductor chip comprises SiC.

12. A double-sided coolable semiconductor package, comprising:
    an upper carrier substrate having an outwardly exposed upper electrically conductive layer, a lower electrically conductive layer and an electrical insulation layer arranged between the upper and lower electrically conductive layers;

a lower carrier substrate having an upper electrically conductive layer, a lower electrically conductive layer having an outwardly exposed surface, and an electrical insulation layer arranged between the upper and lower electrically conductive layers;

a first electrically conductive spacer arranged between the upper carrier substrate and the upper electrically conductive layer of the lower carrier substrate;

a power semiconductor chip arranged between the upper carrier substrate and the upper electrically conductive layer of the lower carrier substrate;

a second electrically conductive spacer arranged between the upper carrier substrate and the power semiconductor chip; and a shielding structure configured to electromagnetically shield a line of the double-sided coolable semiconductor package, wherein a part of the shielding structure is formed in the lower electrically conductive layer of the upper carrier substrate.

13. The double-sided coolable semiconductor package of claim 12, wherein the part of the shielding structure formed in the lower electrically conductive layer of the upper carrier substrate overlaps the control line and is configured to apply a negative supply voltage.

14. The double-sided coolable semiconductor package of claim 12, wherein the part of the shielding structure formed in the lower electrically conductive layer of the upper carrier substrate overlaps a control line formed in the upper electrically conductive layer of the lower carrier substrate and is configured to apply a phase.

15. The double-sided coolable semiconductor package of claim 12, further comprising:
 an encapsulation body arranged between the lower carrier substrate and the upper electrically conductive element,
 wherein the encapsulation body encapsulates the first electrically conductive spacer, the second electrically conductive spacer, the power semiconductor chip, the upper electrically conductive element and the lower carrier substrate.

16. The double-sided coolable semiconductor package of claim 15, wherein the encapsulation body comprises a molding compound.

17. The double-sided coolable semiconductor package of claim 12, wherein the power semiconductor chip comprises SiC.

* * * * *

UNITED STATES PATENT AND TRADEMARK OFFICE
CERTIFICATE OF CORRECTION

PATENT NO. : 10,985,110 B2
APPLICATION NO. : 16/519571
DATED : April 20, 2021
INVENTOR(S) : J. Hoegerl et al.

Page 1 of 1

It is certified that error appears in the above-identified patent and that said Letters Patent is hereby corrected as shown below:

In the Claims

Column 10, Line 35 (Claim 6, Line 6), please change "finger)" to -- finger --.

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*